(12) United States Patent
Kim et al.

(10) Patent No.: US 10,957,557 B2
(45) Date of Patent: Mar. 23, 2021

(54) POLISHING SLURRY AND METHOD OF MANUFACTURING SEMICONDUCTOR DEVICE

(71) Applicant: SAMSUNG ELECTRONICS CO., LTD., Suwon-si (KR)

(72) Inventors: Do Yoon Kim, Hwaseong-si (KR); Kenji Takai, Hwaseong-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 16/444,076

(22) Filed: Jun. 18, 2019

(65) Prior Publication Data

US 2020/0161141 A1   May 21, 2020

(30) Foreign Application Priority Data

Nov. 19, 2018 (KR) .................. 10-2018-0142461

(51) Int. Cl.
| | |
|---|---|
| *H01L 21/321* | (2006.01) |
| *C09G 1/02* | (2006.01) |
| *C09K 3/14* | (2006.01) |
| *B24B 37/04* | (2012.01) |
| *H01L 21/306* | (2006.01) |
| *B82Y 30/00* | (2011.01) |

(52) U.S. Cl.
CPC ........ *H01L 21/3212* (2013.01); *B24B 37/044* (2013.01); *C09G 1/02* (2013.01); *C09K 3/1409* (2013.01); *C09K 3/1463* (2013.01); *H01L 21/30625* (2013.01); *B82Y 30/00* (2013.01); *C01P 2004/51* (2013.01); *C01P 2004/62* (2013.01); *C01P 2004/64* (2013.01)

(58) Field of Classification Search
CPC ............. B24B 37/044; H01L 21/30625; H01L 21/3212; C09K 3/1409; C09K 3/1463; C09G 1/02
USPC .......................................... 252/79.1; 438/693
See application file for complete search history.

(56) References Cited

U.S. PATENT DOCUMENTS

| | | | |
|---|---|---|---|
| 4,956,015 A | 9/1990 | Okajima et al. | |
| 8,349,042 B2 | 1/2013 | Miyatani | |
| 10,278,883 B2 | 5/2019 | Walsh et al. | |
| 2008/0053001 A1 | 3/2008 | Noguchi et al. | |
| 2008/0230095 A1* | 9/2008 | McKechnie | C11D 1/521 134/42 |
| 2010/0242374 A1 | 9/2010 | Noguchi et al. | |
| 2013/0316630 A1* | 11/2013 | Rothenberg | B24B 53/017 451/443 |
| 2016/0220438 A1 | 8/2016 | Walsh et al. | |

(Continued)

FOREIGN PATENT DOCUMENTS

| | | |
|---|---|---|
| EP | 2560790 A2 | 2/2013 |
| JP | 2002030272 A | 1/2002 |

(Continued)

OTHER PUBLICATIONS

PubChem, "Disodium hydrogen phosphate" via https://pubchem.ncbi.nlm.nih.gov/compound/Disodium-hydrogen-phosphate; pp. 1-49; No date available.*

(Continued)

*Primary Examiner* — Binh X Tran
(74) *Attorney, Agent, or Firm* — Cantor Colburn LLP

(57) ABSTRACT

A polishing slurry includes a carbon polishing particle and an exothermic material.

18 Claims, 4 Drawing Sheets

(56) References Cited

U.S. PATENT DOCUMENTS

| | | | |
|---|---|---|---|
| 2017/0202724 A1 | 7/2017 | De Rossi et al. | |
| 2018/0008502 A1* | 1/2018 | Asbeck et al. | |
| 2019/0071588 A1* | 3/2019 | Tada ........................ | C09G 1/02 |
| 2019/0085210 A1* | 3/2019 | Izawa .................. | C09K 3/1463 |

FOREIGN PATENT DOCUMENTS

| | | |
|---|---|---|
| JP | 2004235326 A | 8/2004 |
| JP | 2006287051 A | 10/2006 |
| JP | 2012248594 A | 12/2012 |
| JP | 2016098354 A | 5/2016 |
| JP | 6101552 B2 | 3/2017 |
| KR | 100677386 B1 | 2/2007 |
| KR | 1020080018822 A | 2/2008 |
| KR | 101266537 B1 | 5/2013 |
| KR | 1389828 B1 | 5/2014 |
| WO | 2010038706 A1 | 4/2010 |

OTHER PUBLICATIONS

Y. Takaya et al., "Chemical mechanical polishing of patterned copper wafer surface using water-soluble fullerenol slurry," CIRP Annals—Manufacturing Technology, vol. 60, 2011, pp. 567-570.
Y. Takaya et al., "Performance of water-soluble fullerenol as novel functional molecular abrasive grain for polishing nanosurfaces," CIRP Annals—Manufacturing Technology, vol. 58, 2009, pp. 495-498.

* cited by examiner

POLISHING SLURRY AND METHOD OF MANUFACTURING SEMICONDUCTOR DEVICE

CROSS-REFERENCE TO RELATED APPLICATION

This application claims priority to and the benefit of Korean Patent Application No. 10-2018-0142461, filed in the Korean Intellectual Property Office on Nov. 19, 2018, and all the benefits accruing therefrom under 35 U.S.C. § 119, the content of which is incorporated herein by reference in its entirety.

BACKGROUND

1. Field

A polishing slurry and a method of manufacturing a semiconductor device are disclosed.

2. Description of the Related Art

A semiconductor device includes a structure having a planar surface during the manufacturing process, and the structure may be obtained by a polishing process. One example of the polishing process may be a chemical mechanical polishing (CMP). Chemical mechanical polishing is a process including providing a polishing slurry including polishing particles between a substrate to be polished and a polishing pad, contacting the surface of the semiconductor substrate with the polishing pad, and using the polishing pad to planarize the surface of the semiconductor substrate by applying pressure and rotating the polishing pad and/or the semiconductor substrate.

A high performance and highly integrated semiconductor device is a structure having a fine pitch of less than or equal to about 10 nanometers (nm). A polishing slurry including a polishing particle having a diameter of several tens of nanometers in size may cause damage and shape deformations of fine pitch structures. It would thus be beneficial to provide a polishing slurry capable of providing a planar structure without damaging or deforming the fine pitch structures.

SUMMARY

In order to effectively polish a fine pitch structure, fine polishing particles, e.g., particles having a size of several nanometers, are being evaluated as a replacement for polishing particles having a size of several tens of nanometers. However, these fine polishing particles need to be improved in polishing performance because of a low polishing rate.

An embodiment provides a polishing slurry capable of improving a polishing rate while decreasing damage and shape deformation to a structure.

Another embodiment provides a method of manufacturing a semiconductor device using the polishing slurry.

According to an embodiment, a polishing slurry includes a carbon polishing particle and a first exothermic material.

The first exothermic material may include a material configured to generate heat by mechanical friction.

The first exothermic material may have a heat of condensation of about 150 Joules per gram (J/g) to about 400 J/g.

The first exothermic material may include a hydrophilic material.

The first exothermic material may include sodium acetate ($CH_3COONa$), thiosodium sulfate ($Na_2S_2O_3$), barium hydroxide ($Ba(OH)_2$), sodium sulfate ($Na_2SO_4$), disodium phosphate ($Na_2HPO_4$), calcium chloride ($CaCl_2$), hydrates thereof, or a combination thereof.

The first exothermic material may exist in a supersaturated state in the polishing slurry.

The first exothermic material may be present at a concentration of about 30 moles per liter (mol/L) to about 120 mol/L.

The carbon polishing particle may include a fullerene, a fullerene derivative, or a combination thereof.

The carbon polishing particle may include a hydrophilic fullerene including at least one hydrophilic functional group, and the hydrophilic functional group may include a hydroxyl group, an amino group, a carbonyl group, a carboxyl group, a sulfhydryl group, a phosphate group, or a combination thereof.

The carbon polishing particle may include a hydroxyl fullerene having a structure represented by $C_x(OH)_y$, wherein x is 60, 70, 74, 76, or 78 and y is 12 to 44.

An average particle diameter of the carbon polishing particle may be less than or equal to about 10 nanometers (nm).

The carbon polishing particle may be present in an amount of about 0.01 weight percent (wt %) to about 5 wt %, based on a total weight of the polishing slurry.

The polishing slurry may further include a chelating agent, an oxidizing agent, a surfactant, a dispersing agent, or a combination thereof.

According to another embodiment, a method of manufacturing a semiconductor device includes providing a semiconductor substrate and a to polishing pad facing each other, supplying the polishing slurry between the semiconductor substrate and the polishing pad, and polishing the semiconductor substrate by contacting a surface of the semiconductor substrate with the polishing pad.

The supplying of the polishing slurry may include providing the polishing slurry at a flow rate of about 10 milliliters per minute (ml/min) to about 100 ml/min.

During the polishing, the temperature of the polishing slurry may increase by greater than or equal to about 2° C. relative to a temperature of the supplied polishing slurry.

During the polishing, the temperature of the polishing slurry may be about 26° C. to about 80° C.

The polishing further includes applying a pressure of about 1 pound per square inch (psi) to about 5 psi to the surface of the semiconductor substrate.

The method may further include supplying a second exothermic material between the semiconductor substrate and the polishing pad, where the second exothermic material is the same or different as the first exothermic material included in the polishing slurry.

The polishing slurry may polish a metal wire on the semiconductor substrate.

The polishing slurry may be capable of improving a polishing rate while decreasing damage and shape deformation of a fine pitch structure.

DETAILED DESCRIPTION

Figure 1:
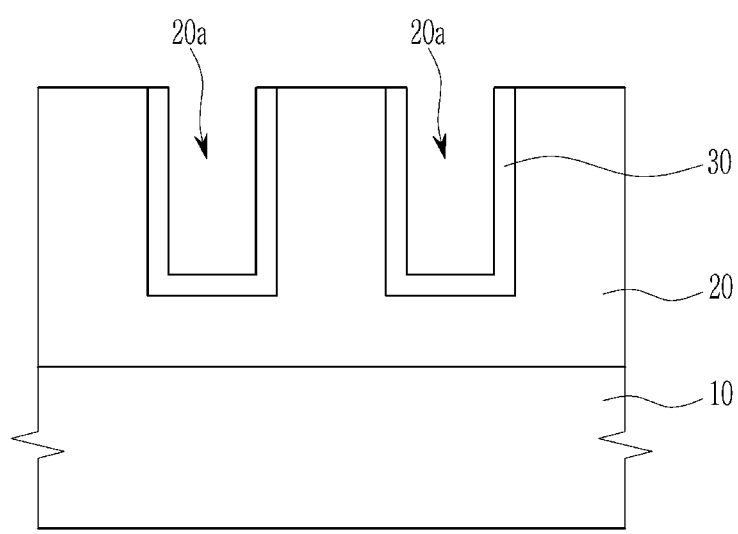
FIGS. 1 to 4 are cross-sectional views sequentially showing a method of manufacturing a semiconductor device, according to an embodiment.

Example embodiments will hereinafter be described in detail, and may be performed by a person having an ordinary skill in the related art without undue experimentation. However, this disclosure may be embodied in many different forms and is not to be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a polishing slurry according to an embodiment is described

A polishing slurry according to an embodiment includes an abrasive and an exothermic material.

The abrasive may include a carbon polishing particle. The carbon polishing particle may be a polishing particle comprising, consisting essentially of, or consisting of carbon or including carbon, and may be, for example, a two-dimensional or three-dimensional particle consisting mainly of carbon or including carbon as a main component.

The carbon polishing particle may be a fine polishing particle. As used herein, the term "fine" refers to a particle having an average particle diameter of less than or equal to about 10 nm. The fine polishing particle may be efficiently applied to a fine pitch structure. The average particle diameter of the carbon polishing particle may be less than or equal to about 8 nm, less than or equal to about 7 nm, less than or equal to about 5 nm, less than or equal to about 3 nm, less than or equal to about 2 nm, or less than or equal to about 1 nm, and may be for example about 0.01 nm to about 10 nm, about 0.01 nm to about 8 nm, about 0.01 nm to about 7 nm, about 0.01 nm to about 5 nm, about 0.01 nm to about 3 nm, about 0.01 nm to about 2 nm, or about 0.01 nm to about 1 nm.

The fine polishing particle may be efficiently applied to a surface having a fine pitch structure without causing damage or deformation of the fine pitch structure.

For example, the carbon polishing particles may be a fullerene, a fullerene derivative, or a combination thereof. The fullerene may be, for example, a fullerene having a carbon number between 50 and 100 (e.g., a carbon number of C50 to C100). For example, the fullerene may have a carbon number C60, C70, C74, C76, or C78, but is not limited thereto.

For example, the fullerene derivative may be a hydrophilic fullerene, and the hydrophilic fullerene may have a structure in which at least one hydrophilic functional group is bound to the fullerene core. For example, the hydrophilic functional group may be covalently bound to the fullerene core. The fullerene core may have, for example, a carbon number of C60, C70, C74, C76, or C78, but is not limited thereto. The hydrophilic functional group may include for example a hydroxyl group, an amino group, a carbonyl group, a carboxyl group, a sulfhydryl group, a phosphate group, or a combination thereof, but is not limited thereto. The hydrophilic functional group may be for example a hydroxyl group.

The hydrophilic fullerene may include, on average, at least two (2) hydrophilic functional groups. For example, the hydrophilic fullerene may include 2 to 44 hydrophilic functional groups on average, 8 to 44 hydrophilic functional groups on average, 12 to 44 hydrophilic functional groups on average, 24 to 44 hydrophilic functional groups on average, 24 to 40 hydrophilic functional groups on average, 24 to 38 hydrophilic functional groups on average, 32 to 44 hydrophilic functional groups on average, 32 to 40 hydrophilic functional groups on average, or 32 to 38 hydrophilic functional groups on average, per fullerene core.

For example, the hydrophilic fullerene may be hydroxyl fullerene, and may have, for example, a structure represented by $C_x(OH)_y$, wherein, x is 60, 70, 74, 76, or 78 and y is 2 to 44. The average number of hydroxyl groups in the hydroxyl fullerene may be measured by an atomic analysis, a thermogravimetric analysis, a spectrophotometric analysis, a mass analysis, or a combination thereof. For example, the number of hydroxyl groups may be an average of two highest peaks in as measured by liquid chromatography mass spectrum (LCMS).

For example, the hydrophilic fullerene may be hydroxyl fullerene having a structure represented by $C_x(OH)_y$, wherein, x is 60, 70, 74, 76, or 78 and y is 12 to 44.

For example, the hydrophilic fullerene may be hydroxyl fullerene having a structure represented by $C_x(OH)_y$, wherein, x is 60, 70, 74, 76, or 78 and y is 24 to 44.

For example, the hydrophilic fullerene may be hydroxyl fullerene having a structure represented by $C_x(OH)_y$, wherein, x is 60, 70, 74, 76, or 78 and y is 32 to 44.

The hydroxyl fullerene may be efficiently dispersed in water.

The carbon polishing particle may be included in the polishing slurry in an amount of about 0.01 wt % to about 5 wt %. Within the range, the carbon polishing particle may be included in the polishing slurry in an amount of about 0.01 wt % to about 3 wt %, about 0.01 wt % to about 2 wt %, about 0.01 wt % to about 1 wt %, about 0.01 wt % to about 0.8 wt %, or about 0.01 wt % to about 0.5 wt %.

The abrasive may further include at least one other polishing particle in addition to the carbon polishing particle.

An exothermic material may be a material capable of generating heat in response to an external force such as a mechanical friction. For example, the exothermic material may be capable of releasing a predetermined amount of latent heat through a phase transition and thus increase a temperature of the polishing slurry.

The exothermic material may present as a liquid phase in the polishing slurry, but may have a phase transition into a solid phase by the application of an external force such as a mechanical friction. As referred to herein, the release of predetermined latent heat, refers to latent heat of condensation. The latent heat of condensation may be the same as heat of fusion.

The exothermic material may include a material having a heat of condensation of about 150 Joules per gram (J/g) to about 400 J/g, or about 175 J/g to about 350 J/g, or about 200 J/g to about 325 J/g, for example, an inorganic material, an organic material, and/or an organic/inorganic material.

The exothermic material may be a hydrophilic material having a heat of condensation and may include, for example sodium acetate ($CH_3COONa$), thiosodium sulfate ($Na_2S_2O_3$), barium hydroxide ($Ba(OH)_2$), sodium sulfate ($Na_2SO_4$), disodium phosphate ($Na_2HPO_4$), calcium chloride ($CaCl_2$), a hydrate thereof, or a combination thereof, but is not limited thereto.

The exothermic material may exist in a supersaturated state in the polishing slurry. For example, the exothermic material in a supersaturated state or a solution including the exothermic material in a supersaturated state may be added to the polishing slurry. For example, the exothermic material may be included at a concentration of about 30 moles per liter (mol/L) to about 120 mol/L in the polishing slurry, and within the range, for example, at a concentration of about 30 mol/L to about 110 mol/L, about 30 mol/L to about 100 mol/l, about 30 mol/L to about 95 mol/L, for example, about 30 mol/L to about 90 mol/L.

The exothermic material may release heat due to a mechanical friction which occurs during the polishing and thereby increase a temperature of the polishing slurry. For example, the temperature of the polishing slurry may be increased by greater than or equal to about 2° C. relative to the initial temperature of the polishing slurry (e.g., the temperature of the polishing slurry as it is being supplied). For example, the temperature of the polishing slurry may be increased by greater than or equal to about 3° C., greater than or equal to about 5° C., greater than or equal to about 7° C., or greater than or equal to about 10° C. during the polishing. In this way, when the temperature of the polishing slurry increases during the polishing, a chemical reaction rate may be increased, and accordingly, polishing efficiency and a polishing rate may be improved.

The polishing slurry may further include an additive and the additive may include for example a chelating agent, an oxidizing agent, a surfactant, a dispersing agent, a pH controlling agent, or a combination thereof, but is not limited thereto.

The chelating agent may include, for example, phosphoric acid, nitric acid, citric acid, malonic acid, a salt thereof, or a combination thereof, but is not limited thereto.

The oxidizing agent may include, for example, hydrogen peroxide, hydrogen peroxide water mixture, sodium hydroxide, potassium hydroxide, or a combination thereof, but is not limited thereto.

The surfactant may include an ionic or non-ionic surfactant, for example, a copolymer of ethylene oxide, a copolymer of propylene oxide, an amine compound, or a combination thereof, but is not limited thereto.

The dispersing agent may promote dispersion of the carbon polishing particles in the polishing slurry and may include, for example, a water-soluble monomer, a water-soluble oligomer, a water-soluble polymer, a metal salt, or a combination thereof. The water-soluble polymer may have a weight average molecular weight of, for example, less than or equal to about 10,000 Daltons, less than or equal to about 5,000 Daltons, or less than or equal to about 3,000 Daltons. The metal salt may include for example a copper salt, a nickel salt, a cobalt salt, a manganese salt, a tantalum salt, a ruthenium salt, or a combination thereof. The dispersing agent may include, for example, poly(meth)acrylic acid, poly(meth)acryl maleic acid, poly(acrylonitrile-co-butadiene-co-acrylic acid), carboxylic acid, a sulfonic ester, sulfonic acid, a phosphoric ester, cellulose, a diol, a salt thereof, or a combination thereof, but is not limited thereto.

The pH controlling agent may control pH of the polishing slurry and may be for example, an inorganic acid, an organic acid, a salt thereof, or a combination thereof. The inorganic acid may include, for example, nitric acid, hydrochloric acid, phosphoric acid, sulfuric acid, hydrofluoric acid, bromic acid, iodic acid, a salt thereof, or a combination thereof.

The organic acid may include, for example, formic acid, malonic acid, maleic acid, oxalic acid, adipic acid, citric acid, acetic acid, propionic acid, fumaric acid, lactic acid, salicylic acid, benzoic acid, succinic acid, phthalic acid, butyric acid, glutaric acid, glutamic acid, glycolic acid, lactic acid, aspartic acid, tartaric acid, a salt thereof, or a combination thereof, but is not limited thereto.

Each additive may be independently included in an amount of about 1 part per million (ppm) to about 100,000 ppm, but is not limited thereto.

The polishing slurry may further include a solvent capable of dissolving or dispersing the above components and the solvent may be, for example, water. The water may be, for example, distilled water and/or deionized water.

The polishing slurry may be employed for providing various structures, for example, the polishing may be applied for a polishing process of a conductor such as a metal wire, or a polishing process of an insulator such as an insulation layer or a shallow trench isolation (STI). As an example, the polishing slurry may be used to polish a conductor such as a metal wire of a semiconductor substrate, and may be used to polish a conductor such as copper (Cu), tungsten (W), or an alloy thereof.

Hereinafter, an example of a method of manufacturing a semiconductor device using the polishing slurry is described.

FIGS. 1 to 4 are cross-sectional views sequentially showing a method of manufacturing a semiconductor device according to an embodiment.

Referring to FIG. 1, an interlayer insulating layer 20 is formed on the semiconductor substrate 10. The interlayer insulating layer 20 may include an oxide, a nitride, an oxynitride, or a combination thereof. Subsequently, the interlayer insulating layer 20 is etched to provide a trench 20a. The trench 20a may have a width of less than or equal to about 10 nm. Subsequently, a barrier layer 30 is formed on the wall surface(s) of the trench. The barrier layer 30 may include, for example, Ta, TaN, or a combination thereof, but is not limited thereto.

Figure 2:
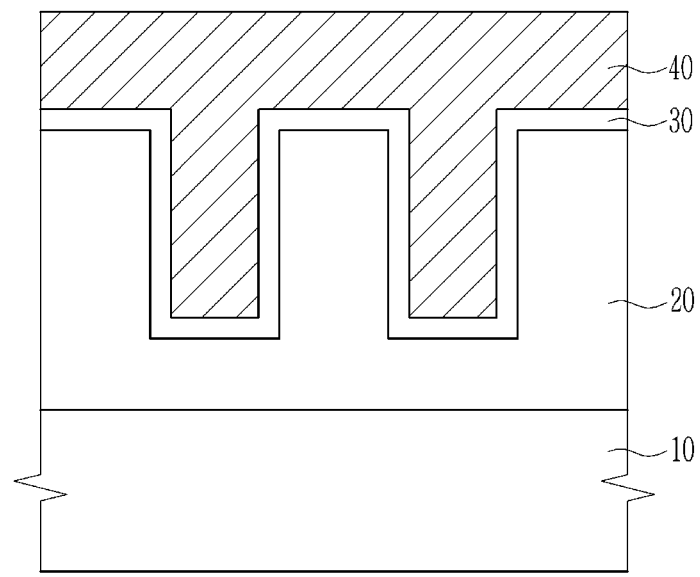

Referring to FIG. 2, a metal such as copper (Cu) or tungsten (W) is filled inside of the trench to provide a metal layer 40.

Figure 3:
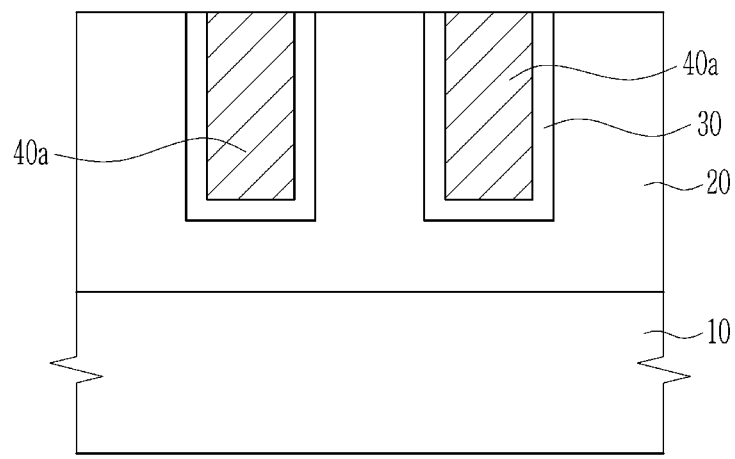

Referring to FIG. 3, a surface of the metal layer 40 is planarized to correspond to the surface of the interlayer insulating layer 20 to form a filled metal layer 40a.

The planarization may be performed by chemical mechanical polishing using chemical mechanical polishing (CMP) equipment, and may use the above-described polishing slurry. For example, when the barrier layer 30 is a Ta layer, and the metal layer 40 is a Cu layer or a W layer, a polishing selectivity of Ta relative to Cu or Ta relative to W of the polishing slurry is much greater for Ta, for example, the polishing slurry has a polishing selectivity which is at least 50 fold greater for Ta as compared to Cu or W.

Figure 4:
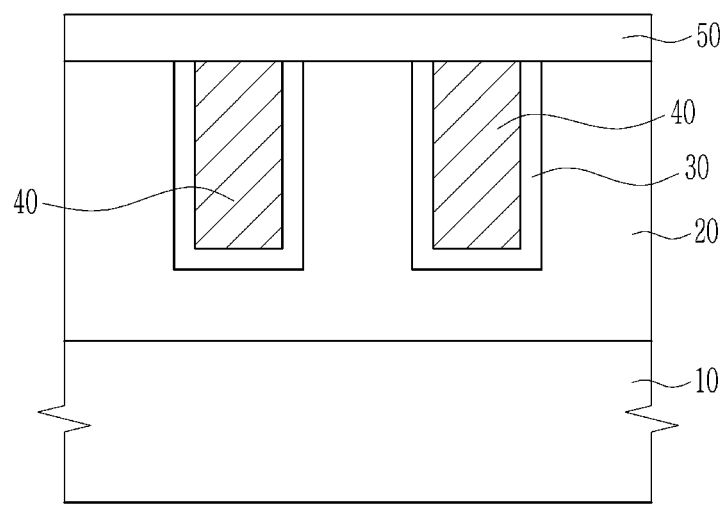

Referring to FIG. 4, a capping layer 50 is formed on the filled metal layer 40 and the interlayer insulating layer 20. The capping layer 50 may include SiN, SiC, or a combination thereof, but is not limited thereto.

Hereinafter, a method of planarization for forming the filled metal layer 40a is described. The planarization may be performed by chemical mechanical polishing using chemical mechanical polishing (CMP) equipment.

The CMP equipment may include, for example, a lower base, a platen capable of rotating on the lower base, a polishing pad disposed on the platen, a pad conditioner, and a polishing slurry supplying equipment for providing the polishing slurry.

The platen may be rotated on the surface of the lower base. For example, the platen may be supplied with a rotation power from a motor disposed in the lower base. Accordingly, the platen may be rotated in a clockwise or counter clockwise direction relative to a center of an imaginary rotating axis perpendicular to the surface thereof. The imaginary rotating axis may also be perpendicular to the surface of the lower base.

The platen may be equipped with at least one supply line through which liquid is injected and discharged. Water may be injected through the supply line and injected inside the platen and thus adjust a temperature of the platen. For example, cooling water may be injected and discharged through the supply line inside of the platen and thus cool down the temperature of the platen. Alternatively, for example, hot water at a high temperature may be injected through the supply line and discharged inside the platen and thus increase the temperature of the platen.

The polishing pad may be disposed on the surface of the platen so that it may be supported by the platen. The polishing pad may be rotated together with the platen. The polishing pad may have a rough polishing surface. This polishing surface may directly contact the semiconductor substrate 10 and thus polish the surface of the semiconductor substrate 10. The polishing pad may be a porous material having a plurality of micropores (e.g., micro-sized voids or spaces) contained therein, which may hold the polishing slurry.

The pad conditioner may be disposed adjacent to the polishing pad and maintain a polishing surface so that the surface of the semiconductor substrate 10 may be effectively polished.

The polishing slurry supplying equipment may be disposed adjacent to the polishing pad and is configured to supply the polishing pad with the polishing slurry. The polishing slurry supplying equipment may include a nozzle supplying the polishing slurry on the polishing pad and a voltage supplying unit applying a predetermined voltage to the nozzle. The polishing slurry in the nozzle is charged by a voltage applied by the voltage supplying unit and discharged toward the polishing pad. The polishing slurry supplying equipment may supply the above polishing slurry.

The chemical mechanical polishing may be, for example, performed by placing (positioning) the semiconductor substrate 10 and a polishing pad facing each other, supplying the polishing slurry from the polishing slurry supplying equipment between the semiconductor substrate 10 and the polishing pad, and polishing the surface of the semiconductor substrate 10 by contacting the surface of the semiconductor substrate with the polishing pad.

For example, the supplying of the polishing slurry may include, for example, providing the polishing slurry between the semiconductor substrate and the polishing pad at a flow rate of about 10 milliliters per minute (ml/min) to about 100 ml/min, for example at a flow rate of about 2 ml/min to about 10 ml/min.

The polishing step may be performed by contacting the surface of the semiconductor substrate 10 with the polishing pad and rotating the polishing pad, the semiconductor substrate, or a combination thereof to produce mechanical friction therebetween. For example, a pressure of about 1 pound per square inch (psi) to about 5 psi may be applied during the polishing step.

The mechanical friction generated during the polishing step may cause the exothermic material in the polishing slurry to release heat and thereby increase a temperature of the polishing slurry. For example, the temperature of the polishing slurry may be increased by greater than or equal to about 2° C., for example, greater than or equal to about 3° C., greater than or equal to about 5° C., greater than or equal to about 7° C., or greater than or equal to about 10° C., relative to the initial temperature of the supplied polishing slurry. For example, in the polishing step, the temperature of the polishing slurry may be in a range of about 25° C. to about 80° C., about 26° C. to about 80° C., about 27° C. to about 80° C., about 30° C. to about 80° C., about 35° C. to about 80° C., or about 40° C. to about 80° C.

In this way, the temperature of the polishing slurry is increased during the polishing, and accordingly, a chemical reaction rate may be increased, and polishing efficiency and a polishing rate may be improved. The polishing step may further include supplying additional exothermic material, which may be the same as or different from the exothermic material included in the polishing slurry.

In addition, the temperature of a neighboring device in contact with the polishing slurry may be increased in the polishing step. For example, a temperature of the platen and the polishing pad thereon may be increased by injecting hot water through a supply line of the platen supply line. As the temperature of the polishing pad is increased, a temperature of the polishing slurry contacting the polishing pad may also be increased. The temperature of the water injected thereinto may be, for example, in a range of about 50° C. to about 100° C., and the temperature of the platen and/or polishing pad during the polishing step may be, for example, in a range of about 30° C. to about 80° C.

In this way, the chemical reaction rate may be further increased by increasing a temperature of a neighboring device in contact with the polishing slurry during the polishing step to thereby improve polishing efficiency and a polishing rate.

As described above, the method of manufacturing a semiconductor device according to an embodiment has been described, but it is not limited thereto, and it may be employed for a semiconductor device having the various structures.

Hereinafter, the embodiments are illustrated in more detail with reference to examples. However, these examples are exemplary, and the present disclosure is not limited thereto.

Synthesis Example: Synthesis of Hydroxyl Fullerene

Beads are added in a bead mill vessel having a height of about 100 mm and a diameter of about 50 mm, to ⅓ of the volume, and then 1 gram (g) of fullerene (C60, Nanom purple ST, Frontier Carbon Corp.), 0.5 g/L of a dispersing agent (polyacrylic acid, Mw 1,800, Merck & Co., Inc.), and 100 g of water are added therein. The beads include 50 g of zirconia beads having an average particle diameter of 500 micrometers (μm), 50 g of zirconia beads having an average particle diameter of 5 mm, and 50 g of zirconia beads having an average particle diameter of 10 mm.

Subsequently, after rotating the vessel for 40 hours, a sample is taken therefrom and particle diameter is measured. The particle diameter is measured by using a dynamic light scattering-type Zeta-potential & particle size analyzer, ELS-Z (Otsuka Electronics Co., Ltd.).

Subsequently, when the sample has a particle diameter of less than or equal to 100 nm, 100 g of a 30 wt % hydrogen peroxide solution is added thereto, and the beads are removed therefrom. Then, the sample is stirred at about 70° C. for 8 days to prepare a hydroxyl fullerene dispersion.

A particle diameter of the hydroxyl fullerene is measured by using the dynamic light scattering-type Zeta-potential & particle size analyzer (ELS-Z).

The average number of hydroxyl groups in the hydroxyl fullerene is evaluated by calculating an average of the two highest peaks in a mass spectrum of the hydroxyl fullerene, as measured in a Fourier transform infrared spectroscopy (FTIR) method.

As a result, the hydroxyl fullerene has a structure of $C_{60}(OH)_{34}$, an average particle diameter of 2.5 nm, and an average number of hydroxyl groups of 34.

Preparation Example: Manufacture of Polishing Slurry

Preparation Example 1

0.1 wt % of the hydroxyl fullerene, having a structure represented by $C_{60}(OH)_{34}$ according to the Synthesis Example, 0.03 wt % of benzotriazole, 1.5 wt % of triammonium citrate, and 0.4 wt % of ammonium dihydrogen phosphate are mixed in water to prepare an aqueous solution.

A separate supersaturated sodium acetate aqueous solution is prepared by adding 50 g of a sodium acetate (heat of condensation: about 289 J/g) to 15 ml of deionized water, slowly heating up the mixture to 70° C., heating the mixture at 70° C. for 30 minutes, and slowly cooling the mixture down sufficiently to room temperature.

Subsequently, the supersaturated sodium acetate aqueous solution is added to the above aqueous solution and then stirred to prepare a polishing slurry (a concentration of the sodium acetate in the polishing slurry: about 90 mol/L).

Preparation Example 2

A polishing slurry (a concentration of the sodium acetate in the polishing slurry: about 40 mol/L) is prepared according to the same method as described in Preparation Example 1 except that the supersaturated sodium acetate aqueous solution is prepared by dissolving 70 g of sodium acetate in 20 ml of deionized water.

Comparative Preparation Example 1

Polishing slurry is prepared according to the same method as described in Preparation Example 1 except that the supersaturated sodium acetate aqueous solution is not used.
Evaluation Polishing is performed under the following conditions.

(1) CMP equipment: MA-200e (Musashino Electronic Corp.)

(2) Polished subject (wafer): a 12 inch-thick silicon wafer having a 1.5 μm-thick Cu film thereon.

(3) Polishing pad: IC1000 (Dow Chemical Co.).

(4) The rotation number of a polishing head: 87 rotations per minute (rpm).

(5) The rotation number of polishing platen: 93 rpm.

(6) An applied pressure: 2 to 3 psi.

(7) Initial temperature: 24° C.

(8) A method of supplying polishing slurry: putting 100 ml of polishing slurry on a polishing pad and polishing with the polishing slurry.

A temperature change of the polishing slurry is examined by polishing with the polishing slurry for 60 seconds and then measuring a temperature of a polishing pad.

A polishing rate (e.g., a material removal rate, MRR) is calculated by polishing with the polishing slurry for 60 seconds, obtaining a thickness of a metal layer before and after the polishing (through conversion from electrical resistance), and obtaining a speed through conversion therefrom. The results are shown in Table 1.

TABLE 1

|  | Temperature (° C.) | MRR (nm/min) | MRR increase rate (%) |
|---|---|---|---|
| Preparation Example 1 | 28 | 100 | 47 |
| Preparation Example 2 | 40 | 125 | 84 |
| Comparative Preparation Example 1 | 24 | 68 | 0 (ref.) |

Referring to Table 1, when each polishing slurry according to Preparation Examples 1 and 2 is used, a temperature increase of the polishing slurry is confirmed as compared with the case of using the polishing slurry according to Comparative Preparation Example 1, which indicates improvement of the polishing rate (MRR).

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A polishing slurry comprising:
a carbon polishing particle; and
a first exothermic material,
wherein the first exothermic material exists in a supersaturated state in the polishing slurry and is present at a concentration of about 30 moles per liter to about 120 moles per liter.

2. The polishing slurry of claim 1, wherein the first exothermic material comprises a material configured to generate heat by mechanical friction.

3. The polishing slurry of claim 1, wherein a heat of condensation of the first exothermic material is about 150 Joules per gram to about 400 Joules per gram.

4. The polishing slurry of claim 1, wherein the first exothermic material comprises a hydrophilic material.

5. The polishing slurry of claim 1, wherein the first exothermic material comprises sodium acetate, thiosodium sulfate, barium hydroxide, sodium sulfate, disodium phosphate, calcium chloride, a hydrate thereof, or a combination thereof.

6. The polishing slurry of claim 1, wherein the carbon polishing particle comprises a fullerene, a fullerene derivative, or a combination thereof.

7. The polishing slurry of claim 1, wherein
the carbon polishing particle comprises a hydrophilic fullerene comprising at least one hydrophilic functional group, and
the hydrophilic functional group comprises a hydroxyl group, an amino group, a carbonyl group, a carboxyl group, a sulfhydryl group, a phosphate group, or a combination thereof.

8. The polishing slurry of claim 1, wherein the carbon polishing particle comprises a hydroxyl fullerene having a structure represented by $C_x(OH)_y$, wherein, x is 60, 70, 74, 76, or 78 and y is 12 to 44.

9. The polishing slurry of claim 1, wherein an average particle diameter of the carbon polishing particle is less than or equal to about 10 nanometers.

10. The polishing slurry of claim 1, wherein the carbon polishing particle is present in an amount of about 0.01 weight percent to about 5 weight percent, based on a total weight of the polishing slurry.

11. The polishing slurry of claim 1, further comprising a chelating agent, an oxidizing agent, a surfactant, a dispersing agent, or a combination thereof.

12. A method of manufacturing a semiconductor device, comprising
placing a semiconductor substrate and a polishing pad facing each other,
supplying the polishing slurry of claim 1 between the semiconductor substrate and the polishing pad, and
polishing a surface of the semiconductor substrate by contacting the surface of the semiconductor substrate with the polishing pad.

13. The method of claim 12, wherein the supplying of the polishing slurry comprises providing the polishing slurry between the semiconductor substrate and the polishing pad at a flow rate of about 10 milliliters per minute to about 100 milliliters per minute.

14. The method of claim 12, wherein during the polishing, the temperature of the polishing slurry increases by greater than or equal to about 2° C. relative to an initial temperature of the supplied polishing slurry.

15. The method of claim 12, wherein during the polishing, the temperature of the polishing slurry is about 26° C. to about 80° C.

16. The method of claim 12, wherein the polishing further comprises applying a pressure of about 1 pound per square inch to about 5 pounds per square inch to the surface of the semiconductor substrate.

17. The method of claim 12, further comprising supplying a second exothermic material between the semiconductor substrate and the polishing pad, wherein the second exothermic material is the same or different as the first exothermic material included in the polishing slurry.

18. The method of claim 12, wherein the polishing slurry polishes a metal wire on the semiconductor substrate.

* * * * *